United States Patent
Zhi et al.

(10) Patent No.: US 11,086,044 B2
(45) Date of Patent: Aug. 10, 2021

(54) SHALE OIL ANALYSIS METHOD AND APPARATUS FOR CONTINUOUSLY CHARACTERIZING SATURATION OF ADSORBED OIL AND FREE OIL

(71) Applicant: PetroChina Company Limited, Beijing (CN)

(72) Inventors: Dongming Zhi, Beijing (CN); Lichun Kuang, Beijing (CN); Xiaojun Wang, Beijing (CN); Zhongchun Sun, Beijing (CN); Zhijun Qin, Beijing (CN); Wei Wang, Beijing (CN); Ni Zhang, Beijing (CN); Xinjun Mao, Beijing (CN); Min Ouyang, Beijing (CN); Qiusheng Chang, Beijing (CN)

(73) Assignee: PETROCHINA COMPANY LIMITED, Beijing (CN)

( * ) Notice: Subject to any disclaimer, the term of this patent is extended or adjusted under 35 U.S.C. 154(b) by 0 days.

(21) Appl. No.: 16/729,606

(22) Filed: Dec. 30, 2019

(65) Prior Publication Data

US 2021/0079789 A1 Mar. 18, 2021

(30) Foreign Application Priority Data

Sep. 17, 2019 (CN) .......................... 201910876168.1

(51) Int. Cl.
*G01V 3/32* (2006.01)
*E21B 49/02* (2006.01)
*G01V 3/14* (2006.01)

(52) U.S. Cl.
CPC ............... *G01V 3/32* (2013.01); *E21B 49/02* (2013.01); *G01V 3/14* (2013.01)

(58) Field of Classification Search
CPC . G01V 1/40; G01V 11/00; G01V 3/18; G01V 3/32; G01V 3/14; G01V 3/38;
(Continued)

(56) References Cited

U.S. PATENT DOCUMENTS 7,397,240 B2 * 7/2008 Fleury ................... G01R 33/44
324/303
9,575,203 B2 * 2/2017 Chen ........................ G01V 3/32
(Continued)

FOREIGN PATENT DOCUMENTS

CN 101750633 A 6/2010
CN 102434152 A 5/2012
(Continued)

OTHER PUBLICATIONS

Zhou et al; Comprehensive Testing Method for Oil Saturation Parameters in Reservoirs Based on NMR Technology; Science Technology and Engr., vol. 14, No. 21, Jul. 31, 2014.
(Continued)

*Primary Examiner* — Jay Patidar
(74) *Attorney, Agent, or Firm* — Harness, Dickey & Pierce, P.L.C.

(57) ABSTRACT

A shale oil analysis method and apparatus for continuously characterizing saturation of adsorbed oil and free oil, comprising: obtain NMR T2 spectrum, NMR porosity, oil saturation and wettability indexes of a core samples, determine a lower limit value for the saturation calculation of the absorbed oil based on the NMR T2 spectrum, the NMR porosity, the oil saturation and wettability indices; determining a lower limit value for the saturation calculation of the free oil according to the bulk relaxation $T_2$ spectrum of the crude oil of the well interval or an adjacent well interval and the NMR $T_2$ spectrum of the core samples; calculating the saturation of the absorbed oil and the free oil, and analyzing the shale oil in the well interval to be analyzed. The solution realizes the quantitative and continuous characterization of the adsorbed oil and the free oil of the shale oil via well logs.

12 Claims, 9 Drawing Sheets

(58) Field of Classification Search
CPC ........ E21B 49/02; G01N 24/08; G01N 13/00; G01N 13/04
See application file for complete search history.

(56) References Cited

U.S. PATENT DOCUMENTS

| | | | |
|---|---|---|---|
| 2004/0130324 | A1 | 7/2004 | Edwards |
| 2016/0231461 | A1 | 8/2016 | Galford et al. |
| 2018/0088016 | A1* | 3/2018 | Yang .................... G01N 24/081 |
| 2020/0174152 | A1* | 6/2020 | Kesserwan ............. G01V 3/38 |

FOREIGN PATENT DOCUMENTS

| | | |
|---|---|---|
| CN | 103383378 A | 11/2013 |
| CN | 103630669 A | 3/2014 |
| CN | 104237965 A | 12/2014 |
| CN | 104777181 A | 7/2015 |
| CN | 104777181 A | 7/2015 |
| CN | 106290045 A | 1/2017 |
| CN | 106290045 A | 1/2017 |
| CN | 106525888 A | 3/2017 |
| CN | 206114618 U | 4/2017 |
| CN | 108169099 A | 6/2018 |
| CN | 108169099 A | 6/2018 |
| CN | 108896598 A | 11/2018 |
| CN | 108896598 A | 11/2018 |

OTHER PUBLICATIONS

Zhao Pei-Qiang, et al, Study on the response mechanisms of nuclear magnetic resonance (NMR) log in tight oil reservoirs, Chinese Journal of Geophysics, vol. 59. No. 5.

Li Jungian, et al., Quantitative evaluation models of adsorbed and free shale oil and its microscopic occurrence mechanism, Oil & Gas Geology, vol. 4 No. 3.

First Search Report (in Chinese and English) dated Apr. 10, 2020 in corresponding Chinese Application No. 201910876168.1.

Supplemental Search Report (in Chinese and English) dated Jun. 5, 2020 in corresponding Chinse Application No. 201910876168.1.

Pei-Qaing Zhao, Study on the response mechanisms of nuclear magnetic resonance (NMR) log in tight oil reservoirs; Chinese Journal of Geophysics, vol. 59, No. 5, May 2016.

Jungian Li, Quantitative evaluation models of adsorbed and free shale oil and its microscopic occurrence mechanism; Oil & Gas Geology, Jun. 2019.

* cited by examiner acquiring a bulk relaxation $T_2$ spectrum of crude oil under a formation temperature condition in the well interval to be analyzed and a well interval having a same depth as a depth of the well interval to be analyzed in an adjacent well ⌒1031

Selecting the NMR $T_2$ spectrum of multiple first core sample corresponding to multiple second core sample with the wettability index representing a strongly oil-wet property according to the wettability index of the corresponding second core sample, comparing the NMR $T_2$ spectrum of the corresponding multiple first core sample with the bulk relaxation $T_2$ spectrum of the crude oil, when it is recognized that the last peak of the NMR $T_2$ spectrum of the corresponding multiple first core sample is the bulk relaxation spectrum and the time corresponding to the left valley of the NMR $T_2$ volume of the corresponding multiple first parallel analysis samples is the same, determining the time corresponding to the left valley as the lower limit value for the saturation calculation of the free oil ⌒1032

SHALE OIL ANALYSIS METHOD AND APPARATUS FOR CONTINUOUSLY CHARACTERIZING SATURATION OF ADSORBED OIL AND FREE OIL

CROSS REFERENCE TO RELATED APPLICATIONS

This application claims priority from Chinese Application Number 201910876168.1, entitled "Shale Oil Analysis Method and Apparatus for Continuously Characterizing Saturation of Adsorbed Oil and Free Oil", filed on Sep. 17, 2019, the subject matter of which is incorporated herein by reference.

TECHNICAL FIELD

The invention relates to the technical field of shale oil exploration and development, in particular, to a shale oil analysis method and apparatus for continuously characterizing saturation of adsorbed oil and free oil.

BACKGROUND

Globally, shale oil (gas) resources are abundant, providing a new and important field for oil and gas exploration and development. Shale oil can be classified into adsorbed oil and free oil according to difference of mobility. Free oil can be effectively produced by hydraulic fracturing. However, due to its large adsorption energy, adsorbed oil needs to be transformed into free oil in situ, which makes it more difficult to be produced. Therefore, the quantitative and continuous characterization of saturation of adsorbed oil and free oil of the shale oil reservoirs is a key technology for predicting and accurate positioning a shale oil "sweet spot", but is also a technical problem universally acknowledged in the industry. Up to now, the continuous characterization of adsorbed oil and free oil via well logs is still a technical blank in the industry, and becomes a technical bottleneck for evaluating and accurately locating a shale oil "sweet spot" (referring to a formation with a large oil content suitable for development and production).

SUMMARY OF THE INVENTION

Embodiments of the present invention provide a shale oil analysis method and apparatus for continuously characterizing saturation of adsorbed oil and free oil, which solve the technical problem in the prior art that it is impossible to continuously characterize the adsorbed oil and free oil via well logs.

An embodiment of the present invention provides a method for continuously characterizing saturation of adsorption oil and free oil, the method comprising:

acquiring NMR log data of a well interval to be analyzed;

performing a NMR measurement, a saturation measurement and an Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit value for the saturation calculation of the absorbed oil based on the NMR $T_2$ spectrum, the NMR porosity, the oil saturation and the wettability index of the core sample;

acquiring a bulk relaxation $T_2$ spectrum of crude oil in the well interval to be analyzed and a well interval having a same depth as a depth of the well interval to be analyzed in an adjacent well, and determining a lower limit value for the saturation calculation of the free oil according to the bulk relaxation $T_2$ spectrum of the crude oil and the NMR $T_2$ spectrum of the core sample;

continuously and quantitatively calculating the saturation of the absorbed oil and the free oil in the well interval to be analyzed, according the NMR log data of the well interval to be analyzed, the lower limit value for the saturation calculation of the absorbed oil and the free oil; and analyzing the shale oil in the well interval to be analyzed, according to the saturation of the absorbed oil and the free oil in the well interval to be analyzed.

An embodiment of the invention also provides a computer device comprising a memory, a processor and a computer program stored on the memory and executable by the processor, when executing the computer program, the processor implements the following steps of:

acquiring NMR log data of a well interval to be analyzed;

performing a NMR measurement, a saturation measurement and an Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit value for the saturation calculation of the absorbed oil based on the NMR $T_2$ spectrum, the NMR porosity, the oil saturation and the wettability index of the core sample;

acquiring a $T_2$ bulk relaxation spectrum of crude oil in the well interval to be analyzed and a well interval having a same depth as a depth of the well interval to be analyzed in an adjacent well, and determining a lower limit value for the saturation calculation of the free oil according to the $T_2$ bulk relaxation spectrum of the crude oil and the NMR $T_2$ spectrum of the core sample;

continuously and quantitatively calculating the saturation of the absorbed oil and the free oil in the well interval to be analyzed, according the NMR log data of the well interval to be analyzed, the lower limit value for the saturation calculation of the absorbed oil and the free oil; and analyzing the shale oil in the well interval to be analyzed, according to the saturation of the absorbed oil and the free oil in the well interval to be analyzed.

An embodiment of the present invention also provides a computer-readable storage medium which stores a computer program for executing the following steps of:

acquiring NMR log data of a well interval to be analyzed;

performing a NMR measurement, a saturation measurement and an Amott wettability measurement on a core sample acquired from a "sweet spot" in the well section to be analyzed, to obtain a NMR $T_2$ spectrum, a NMR porosity, an oil saturation and a wettability index of the core sample, and determine a lower limit value for the saturation calculation of the absorbed oil based on the NMR $T_2$ spectrum, the NMR porosity, the oil saturation and the wettability index of the core sample;

acquiring a bulk relaxation $T_2$ spectrum of crude oil in the well interval to be analyzed and a well interval having a same depth as a depth of the well interval to be analyzed in an adjacent well, and determining a lower limit value for the saturation calculation of the free oil according to the $T_2$ bulk relaxation spectrum of the crude oil and the NMR $T_2$ spectrum of the core sample;

continuously and quantitatively calculating the saturation of the absorbed oil and the free oil in the well interval to be analyzed, according the NMR logging data of the well to be analyzed, the lower limit value for the saturation calculation of the absorbed oil and the free oil; and analyzing the shale oil in the well interval to be analyzed, according to the saturation of the absorbed oil and the free oil in the well interval to be analyzed.

In the embodiments of the invention, the lower limit value for the saturation calculation of the absorbed oil is comprehensively determined by using a core wettability, a saturation and a NMR $T_2$ spectrum; the lower limit value for the saturation calculation of the free oil is determined by using the bulk relaxation spectrum of the crude oil and a NMR measurement of the core; the saturation of the adsorbed oil and the free oil are calculated continuously by using the NMR log spectrum, the lower limit value for the saturation calculation of the absorbed oil and the free oil; and the shale oil in the well interval to be analyzed is analyzed according to the saturation of the absorbed oil and the free oil. Compared with the prior art, the invention realizes the quantitative and continuous characterization of the adsorbed oil and the free oil via well logs in the shale oil reservoirs, solves the technical problem in the industry, and provides core parameters for evaluation and production of the shale oil "sweet spot".

BRIEF DESCRIPTION OF THE DRAWINGS

In order to more clearly explain the technical solution in the embodiments of the invention or in the prior art, drawings that need to be used in the description in the embodiments or the prior art will be simply introduced below. Apparently, the drawings in the following description are merely some examples of the invention, it is also possible for persons ordinarily skilled in the art to obtain other drawings according to these drawings without making creative efforts.

FIG. 3 is a flow chart for determining a lower limit value for the saturation calculation of free oil provided in an embodiment of the present invention;

DETAILED DESCRIPTION OF THE PREFERRED EMBODIMENT

The technical solution in the embodiments of the present invention will be described clearly and integrally below in combination with the accompanying drawings in the embodiments of the present invention, and obviously the described embodiments are merely part of the embodiments, rather than all of the embodiments. Based on the embodiments of the present invention, all the other embodiments that are obtained by persons skilled in the art without making creative efforts fall within the protection scope of the present invention.

After experimental research, it is found that, unlike the conventional water-wet oil layers with buoyancy accumulation, the shale oil reservoir is usually mixed-wet or oil-wet, which is characterized by oil-bearing pores being oil-wet and water-bearing pores being water-wet. Under the condition of a certain reservoir filling pressure, it appears as a mode in which "large pores" are oil-bearing and oil-wet as well as "small pores" are water-containing and water-wet.

After experimental research, it is found that, unlike the conventional reservoir, the shale oil reservoir has no drilling fluid invasion, and the measurement range of NMR is basically undisturbed formation. For the shale oil, the NMR response is characterized by the sum of contributions of surface relaxation of absorbed water, surface relaxation of oil-wet pore absorbed oil, and bulk relaxation of free oil. The area of a bulk relaxation peak is the bulk of the free oil, and the area of distribution range of the surface adsorbed oil reflects the volume of the adsorbed oil.

On the basis of the above experimental findings, the present invention establishes a solution of determining lower limit values of calculation of absorbed oil and free oil by comprehensively applying the core NMR $T_2$ spectrum, wettability and saturation supporting experimental data, so as to apply the solution of continuously calculating the saturation of the absorbed oil and the free oil by using the NMR log data.

Figure 1:
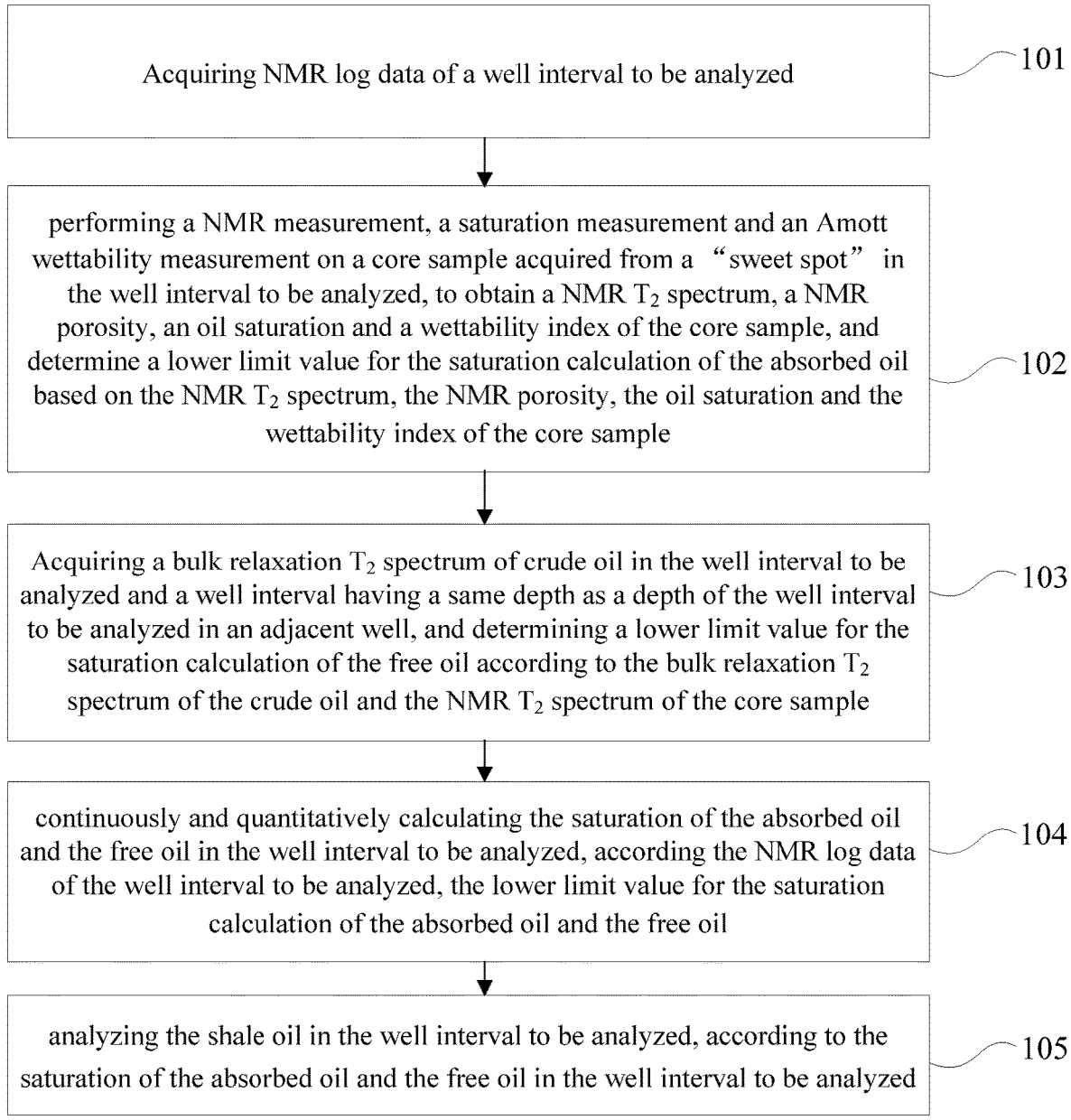
FIG. 1 is a flow chart of a shale oil analysis method for continuously characterizing saturation of absorbed oil and free oil provided in an embodiment of the present invention.

As shown in FIG. 1, the shale oil analysis method for continuously characterizing saturation of absorbed oil and free oil comprises:

Step 101: acquiring NMR (nuclear magnetic resonance) log data of a well section to be analyzed.

Step 102: performing a NMR measurement, a saturation measurement and an Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit value for the saturation calculation of the absorbed oil based on the NMR $T_2$ spectrum, the NMR porosity, the oil saturation and the wettability index of the core sample.

Specifically, before performing the step 102, the following operations are performed at first: (1) performing drilling closed coring in a "sweet spot" in a well section to be analyzed, to obtain a core sample full of oil and well preserved in situ; (2) horizontally drilling a core sample of 1 inch on full-diameter core samples with good oil-bearing properties (drilling a core plunger sample in a direction parallel to bedding), and splitting it in two to form twin core samples including a first core sample for the NMR measurement and saturation measurement, and a second core sample for the Amott wettability measurement.

Figure 2:
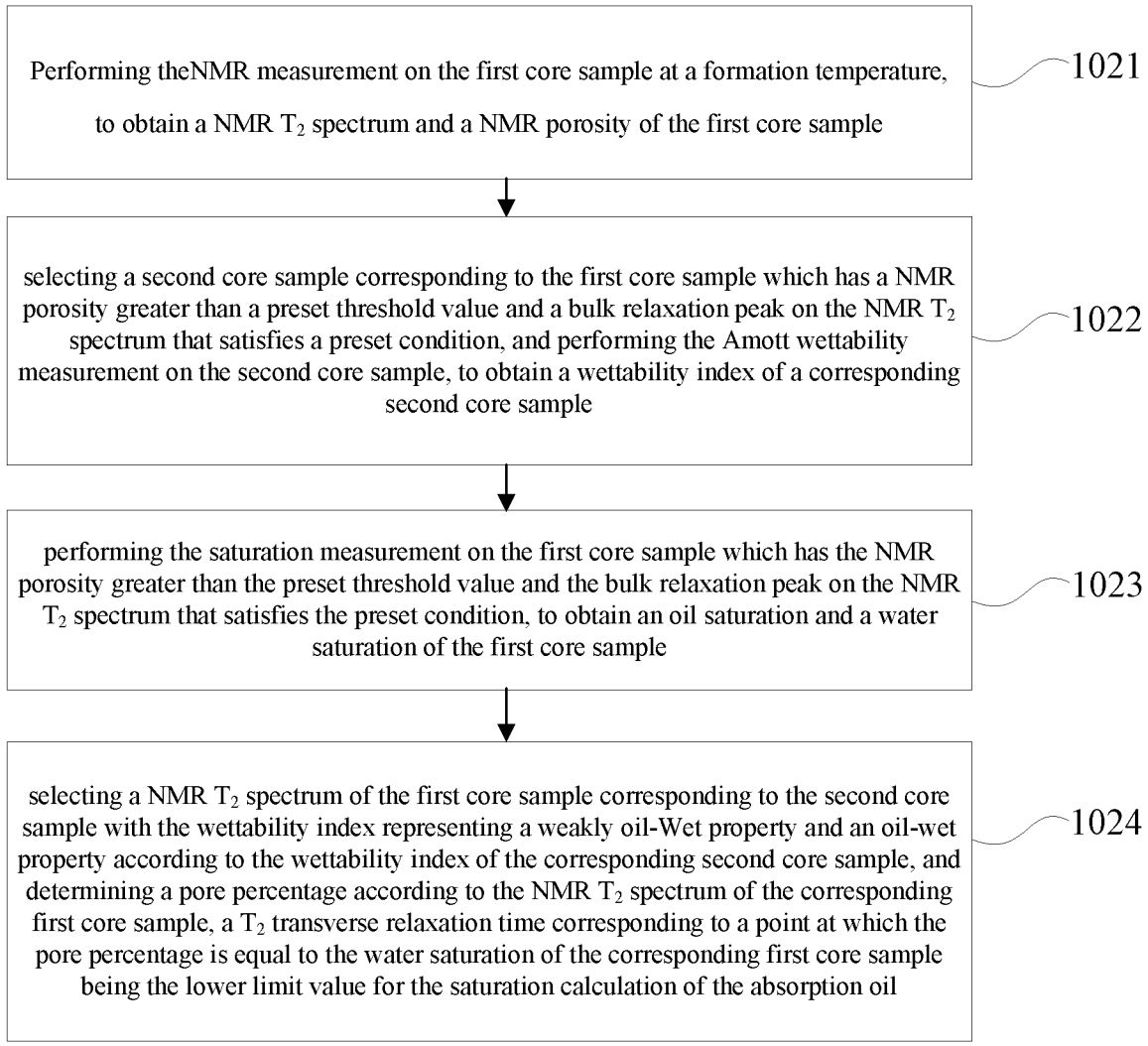
FIG. 2 is a flow chart for determining a lower limit value for the saturation calculation of absorbed oil provided in an embodiment of the present invention.

As shown in FIG. 2, the step 102 specifically includes:

Step 1021: performing the NMR measurement on the first core sample at a formation temperature, to obtain a NMR $T_2$ spectrum and a NMR porosity of the first core sample.

Step 1022: selecting a second core sample corresponding to the first core sample which has a NMR porosity greater than a preset threshold value (that is, the NMR porosity is relatively large) and a bulk relaxation peak on the NMR $T_2$ spectrum (which refers to the rightmost peak on the $T_2$ spectrum) that satisfies a preset condition (that is, the NMR $T_2$ spectrum has an obvious bulk relaxation), and performing the Amott wettability measurement on the second core sample, to obtain a wettability index of a corresponding second core sample.

The calculation formula of the wettability index is:

$$I_A = I_w - I_o;$$

where, $I_A$ denotes a wettability index; $I_w$ denotes a water-wet index, and $I_o$ denotes an oil-wet index.

The numerical range of the wettability index $I_A$ is between −1 and +1, reflecting the wetting ability of rock and oil-water phases. When the wettability index is greater than 0, the water-wet ability of the reservoir is stronger, and when the wettability index is smaller than 0, the oil-wet ability of the reservoir is stronger. The criteria for classification of rock wettability using the wettability index are shown in Table 1.

TABLE 1

| Wetta-bility Index | Standard for evaluation of wettability of reservoir rock by wettability index | | | | | | |
|---|---|---|---|---|---|---|---|
| | | | | Medium Wet | | | |
| | Strongly oil-wet | Oil-wet | Weakly oil-wet | Neutrally wet | Weakly water-wet | Water-wet | Strongly water-wet |
| $I_A$ | (−1, −0.7) | (−0.7, −0.3) | (−0.3, −0.1) | (−0.1, 0.1) | (0.1, 0.3) | (0.3, 0.7) | (0.7, 1) |

Step 1023: performing the saturation measurement on the first core sample which has the NMR porosity greater than the preset threshold value and the bulk relaxation peak on the NMR $T_2$ spectrum that satisfies the preset condition, to obtain an oil saturation and a water saturation of the first core sample, wherein the water saturation equals to 1 minus the oil saturation.

Step 1024: selecting a NMR $T_2$ spectrum of the first core sample corresponding to the second core sample with the wettability index representing a weakly oil-wet property and an oil-wet property according to the wettability index of the corresponding second core sample, and determining a pore percentage according to the NMR $T_2$ spectrum of the corresponding first core sample, a $T_2$ transverse relaxation time corresponding to a point at which the pore percentage is equal to the water saturation of the corresponding first core sample being the lower limit value for the saturation calculation of the absorbed oil.

Step 103: acquiring a bulk relaxation $T_2$ spectrum of crude oil in the well interval to be analyzed and a well interval having a same depth as a depth of the well interval to be analyzed in an adjacent well, and determining a lower limit value for the saturation calculation of the free oil according to the $T_2$ bulk relaxation spectrum of the crude oil and the NMR $T_2$ spectrum of the core sample.

As shown in FIG. 3, the step 103 specifically includes:

step 1031: acquiring a bulk relaxation $T_2$ spectrum of crude oil under a formation temperature condition in the well interval to be analyzed and a well interval having a same depth as a depth of the well interval to be analyzed in an adjacent well; and step 1032: selecting the NMR $T_2$ spectrum of the multiple first core sample corresponding to the multiple second core sample with the wettability index representing a strongly oil-wet property according to the wettability index of the corresponding second core sample, comparing the NMR $T_2$ spectrum of the corresponding multiple first core sample with the bulk relaxation $T_2$ spectrum of the crude oil, when it is recognized that the rightmost peak of the NMR $T_2$ spectrum of the corresponding multiple first core sample is the bulk relaxation spectrum and the time corresponding to the left valley of the NMR $T_2$ volume of the corresponding multiple first core samples is the same, determining the time corresponding to the left valley as the lower limit value for the saturation calculation of the free oil.

Step 104: continuously and quantitatively calculating the saturation of the absorbed oil and the free oil in the well interval to be analyzed, according the NMR log data of the well interval to be analyzed, the lower limit value for the saturation calculation of the absorbed oil and the free oil.

Herein, the saturation of the absorbed oil is determined according to the following formula:

$$S_{absorption\ oil} = \frac{\sum_{i=T_{2cut1}}^{T_{2cut2}} P_i}{\sum_{i=0.3}^{3000} P_i};$$

where $S_{absorption\ oil}$ denotes the saturation of the absorbed oil; $P_i$ denotes pore volume corresponding to the ith relaxation time component, dimensionless and decimal; $T_{2cut1}$ denotes the lower limit value for the saturation calculation of the absorbed oil, in the unit of ms; and 3000 is the total number of relaxation time components, and may also be other values in practice.

The saturation of the free oil is determined according to the following formula:

$$S_{free\ oil} = \frac{\sum_{i=T_{2cut2}}^{3000} P_i}{\sum_{i=0.3}^{3000} P_i};$$

where, $S_{free\ oil}$ denotes the saturation of free oil, dimensionless and decimal; and $T_{2out2}$ denotes the lower limit value for the saturation calculation of free oil, in the unit of ms.

Step 105: analyzing the shale oil in the well interval to be analyzed, according to the saturation of the absorbed oil and the free oil in the well interval to be analyzed.

Hereinafter, the technical solution of the present invention will be specifically described by taking a well in a shale oil reservoir as an example.

Step 1: performing the sealing core drilling of 25 m in a "sweet spot" to obtain core samples full of oil and well preserved in situ.

Figure 4:
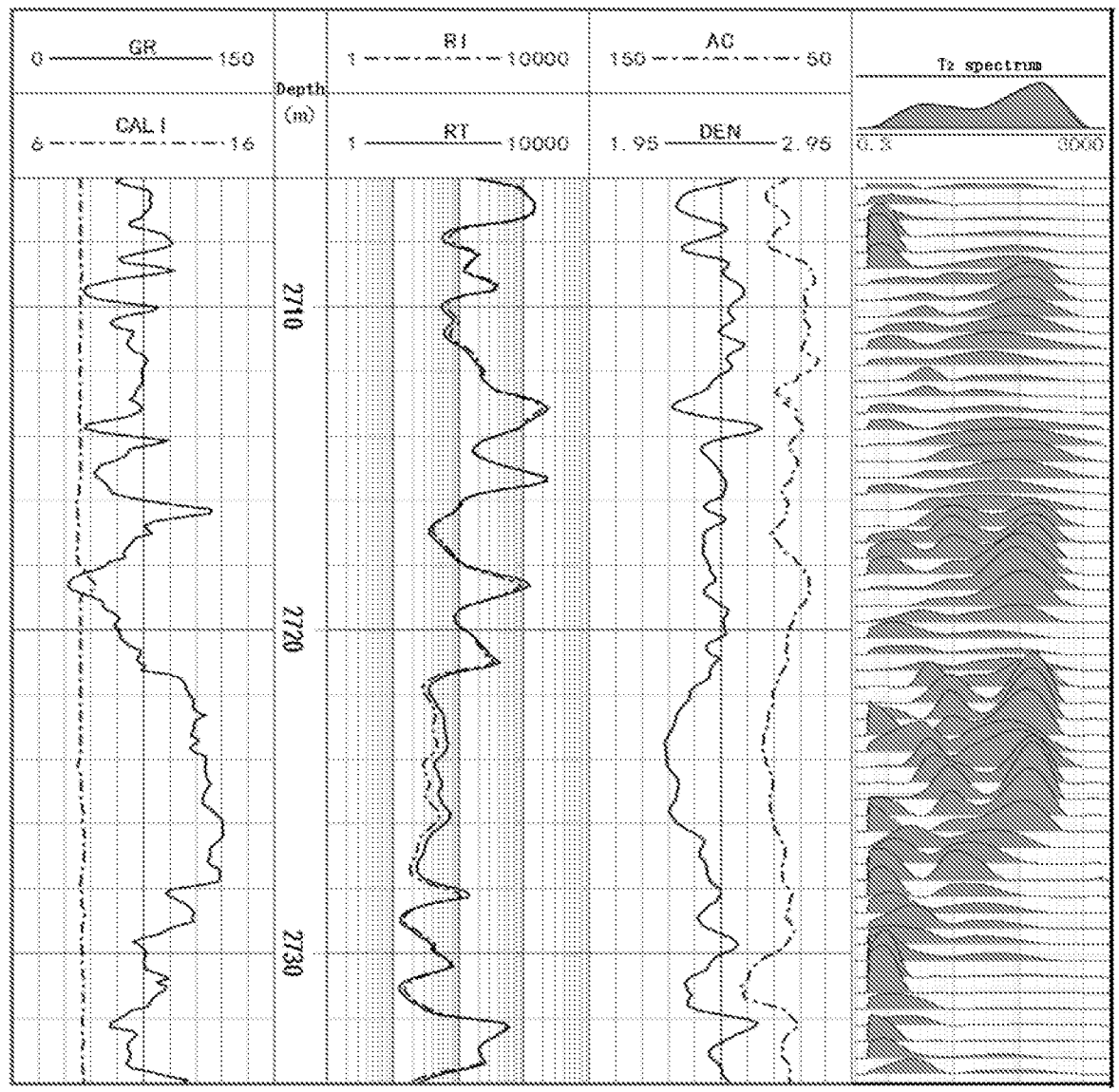
FIG. 4 is a plot of NMR log of a well interval provided in an embodiment of the present invention.

Step 2: performing the NMR log on an interval of the well which includes a "sweet spot", and the resulting plot is shown in FIG. 4, which includes natural gamma ray (GR), shallow resistivity (RI), interval transit time (AC), well diameter (CALI), deep resistivity (RT), compensated density (DEN) and $T_2$ spectrum.

Step 3: drilling a horizontal core sample of 1 inch on full-diameter drilling core samples with good oil-bearing properties (drilling a core plunger sample in a direction parallel to bedding), and splitting it in two to form twin core samples, one of which is used for the NMR measurement and saturation measurement, and the other of which is used for the Amott wettability measurement. There are 10 test samples of NMR $T_2$ spectrum and saturation in the whole well section, and 10 wettability test samples in parallel.

Step 4: performing an NMR experimental measurement under formation temperature conditions on the obtained core samples that are well preserved in situ, to obtain each NMR $T_2$ spectrum, and determine the corresponding NMR porosity of each core sample.

Step 5: selecting four samples with the relatively large NMR porosity and an obvious bulk relaxation peak in the NMR $T_2$ spectrum, and measuring the wettability index of twin samples corresponding to the four samples by using a Amott method. In this embodiment, the wettability measurement method is an inhalation method.

Step 6: determining the oil saturation and the water saturation by using a distillation method for the four samples that perform the wettability measurement and have correspondingly completed the NMR spectrum measurement. The porosity, saturation and wettability indices of the four samples are shown in Table 2.

TABLE 2

Statistical table of measuring parameters of example core samples

| Sample number | NMR porosity % (POR) | Oil saturation % (So) | Wettability index |
|---|---|---|---|
| 1 | 18.5 | 78.0 | −0.12 |
| 2 | 19.0 | 87.0 | −0.39 |
| 3 | 18.5 | 98.6 | −0.89 |
| 4 | 16.4 | 99.4 | −0.97 |

Figure 5:
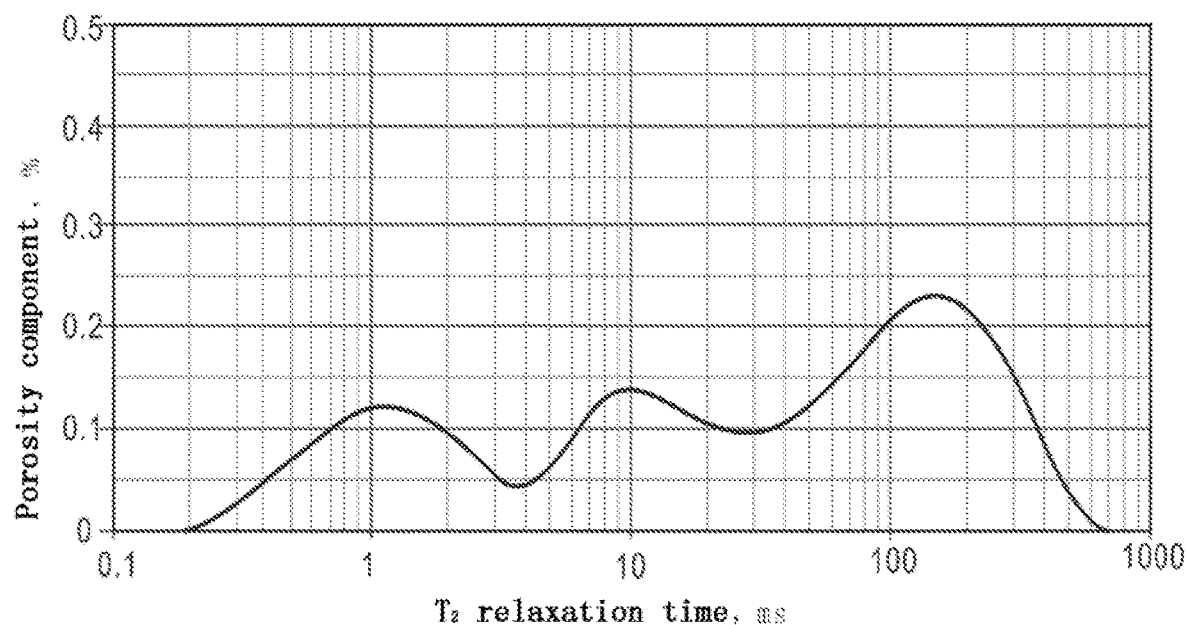
FIG. 5 is a plot of a NMR measurement of Sample 1 (porosity of 18.5%, oil saturation of 78%, wettability index of −0.12) at a formation temperature provided in an embodiment of the present invention.
Figure 6:
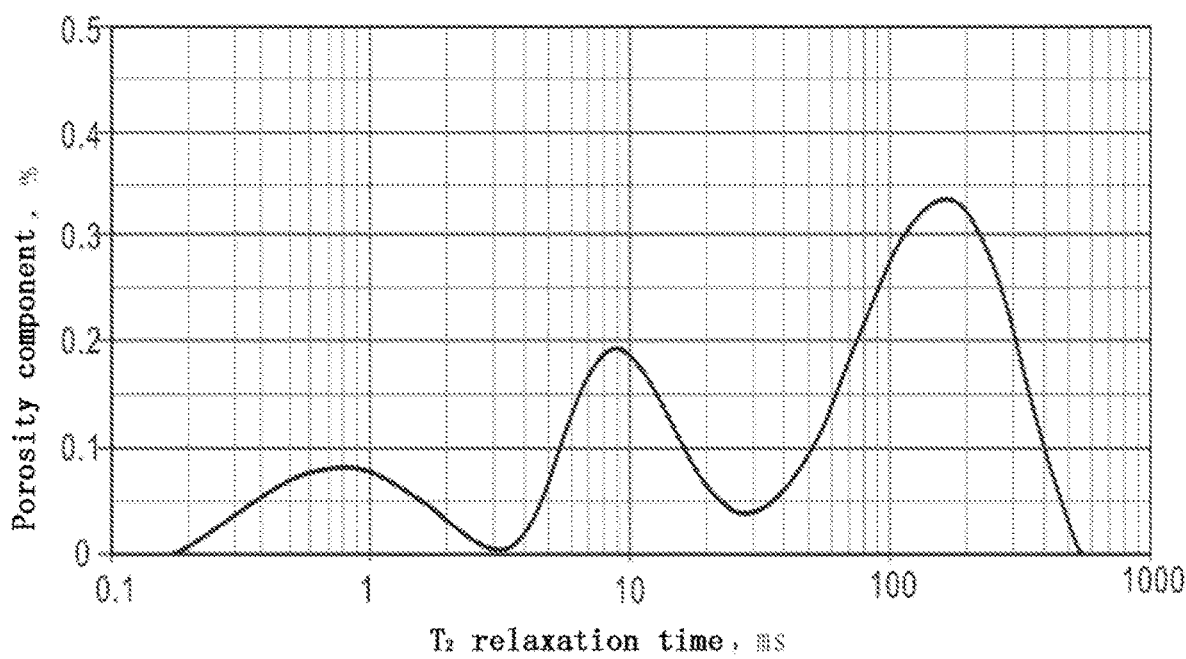
FIG. 6 is a plot of a NMR measurement of Sample 2 (porosity of 19.0%, oil saturation of 87%, wettability index of −0.39) at the formation temperature provided in an embodiment of the present invention.

Step 7: selecting the NMR $T_2$ spectra of two core samples of weakly oil-wet (FIG. 5, Sample 1) and oil-wet (FIG. 6, Sample 2), accumulating their pore volumes from left to right respectively, determining a pore percentage by dividing the pore volume corresponding to the first peak in the $T_2$ spectrum by the accumulated pore volume, and taking $T_2$ transverse relaxation time corresponding to a point at which the pore percentage is equal to the measured water saturation of the core as a $T_2$ cutoff value $T_{2cut1}$ between the absorbed water and the absorbed oil. The determined $T_{2cut1}$ of Sample 1 in this embodiment is 3.4 ms, the determined $T_{2cut1}$ of Sample 2 is 3.3 ms, the comprehensively determined $T_2$ lower limit value $T_{2cut1}$ for the saturation calculation of the absorbed oil is 3.3 ms.

Figure 9:
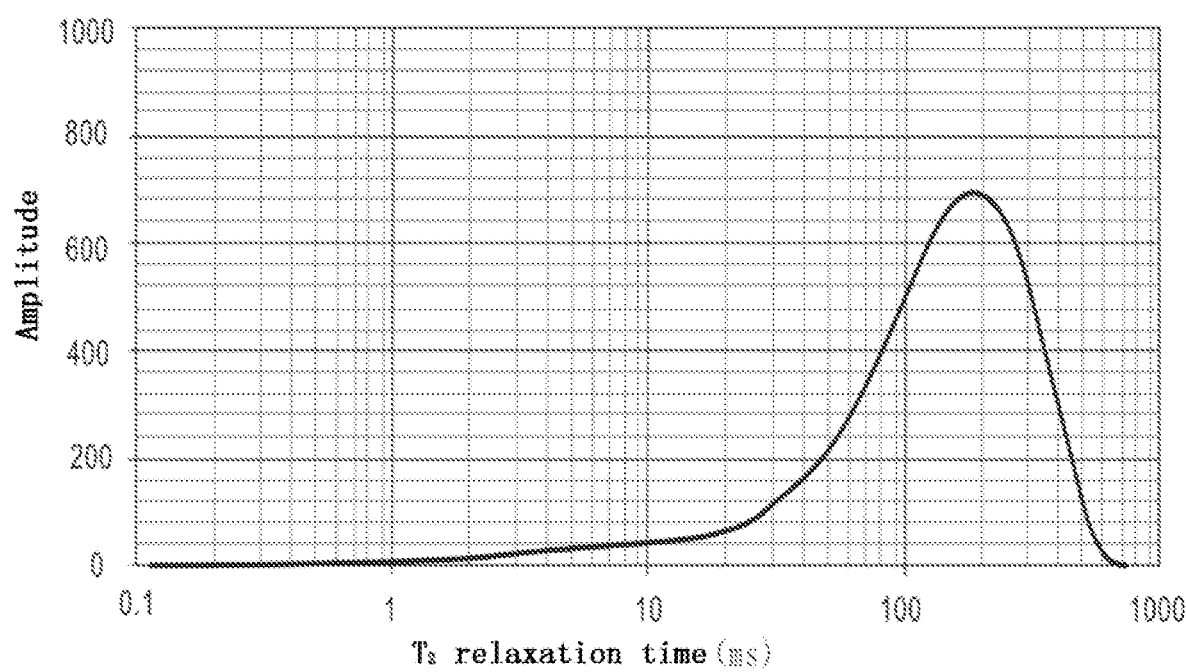
FIG. 9 is a NMR volume relaxation $T_2$ spectrum of crude oil at the formation temperature of the same interval of adjacent wells provided in an embodiment of the present invention.

Step 8: selecting crude oil in a well interval having a same depth as a depth of the well interval to be analyzed in an adjacent well to measure a $T_2$ bulk relaxation spectrum under formation temperature conditions (FIG. 9).

Figure 7:
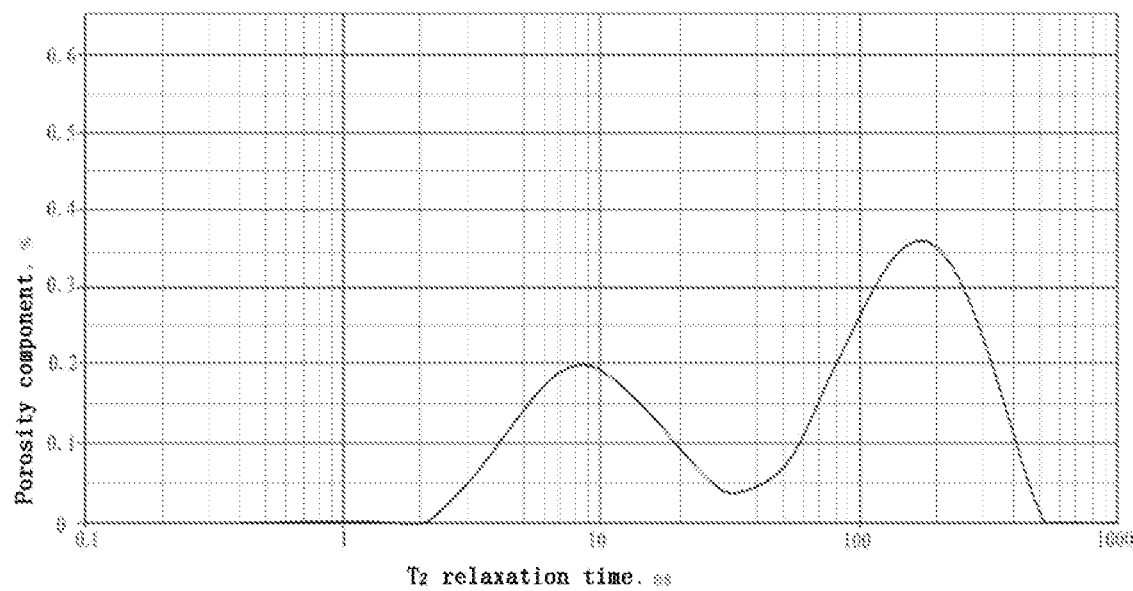
FIG. 7 is a plot of a NMR measurement of Sample 3 (porosity of 18.5%, oil saturation of 98.6%, wettability index of −0.89) at the formation temperature provided in an embodiment of the present invention.
Figure 8:
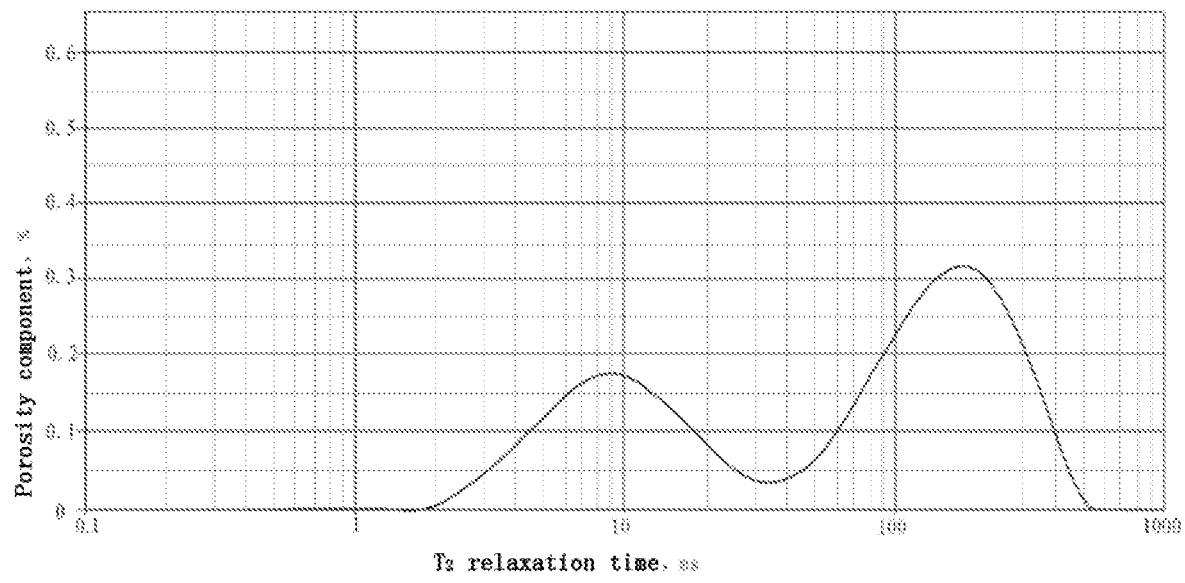
FIG. 8 is a plot of a NMR measurement of Sample 4 (porosity of 16.4%, oil saturation of 99.4%, wettability index of −0.97) at the formation temperature provided in an embodiment of the present invention.

Step 9: comparing the NMR $T_2$ spectra of two core samples of strongly oil-wet (FIG. 7, Sample 3; FIG. 8, Sample 4) with the bulk relaxation $T_2$ spectrum of the crude oil, to recognize the rightmost peak of the NMR measurement of the sample as the bulk relaxation spectrum, the corresponding time of the left valley of two cores of strongly oil-wet are basically the same, that is, about 32 ms, and comparing samples of weakly oil-wet (FIG. 5, Sample 1) and oil-wet (FIG. 6, Sample 2), which results in basically the same value. To the end, the lower limit $T_{2cut2}$ for the saturation calculation of free oil is determined to be 32 ms.

Figure 10:
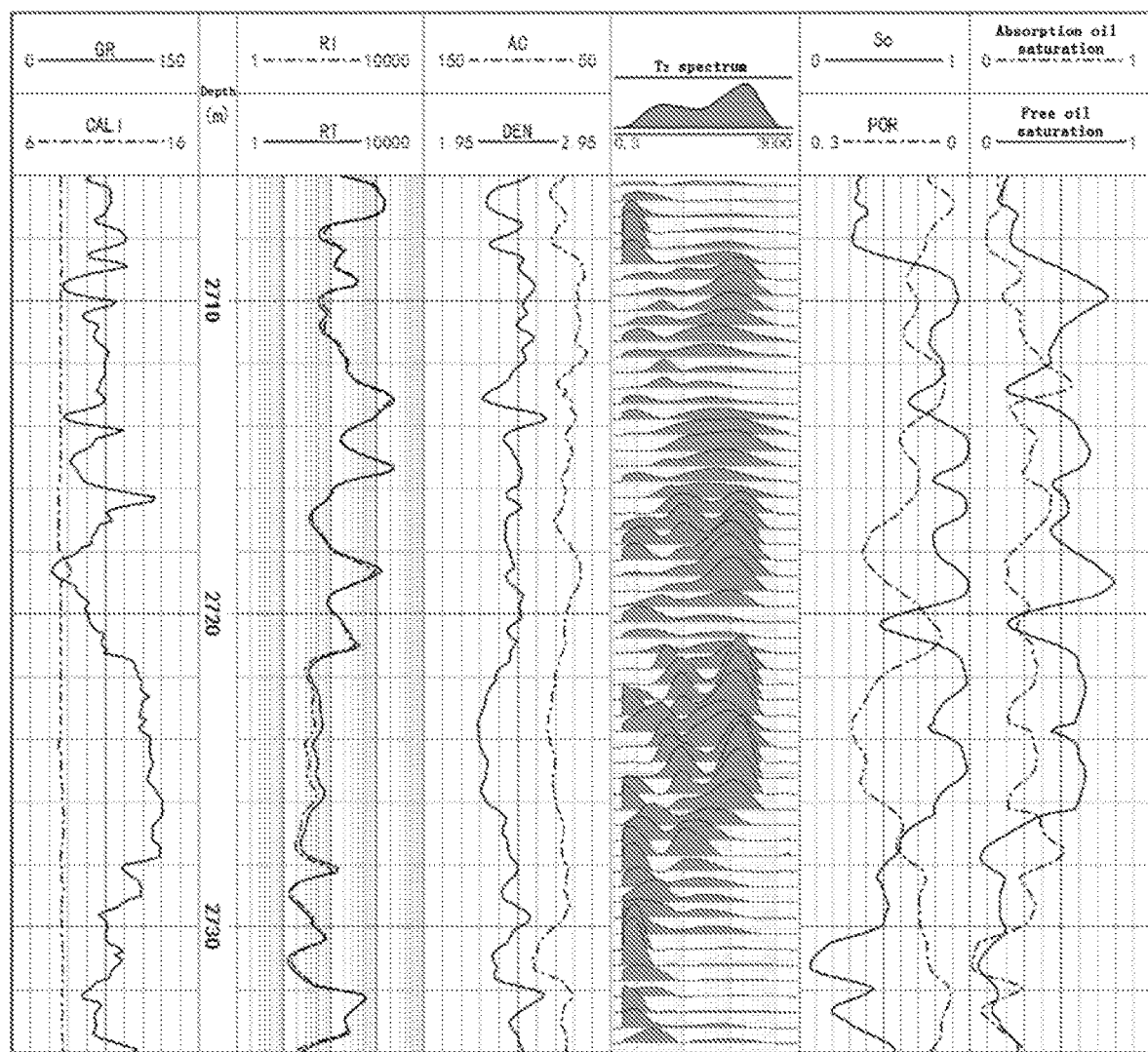
FIG. 10 is a resulting plot showing the saturation of absorbed oil and free oil of the well interval that are calculated by applying NMR log data provided in an embodiment of the present invention.

Step 10: continuously and quantitatively calculating the saturation of the absorbed oil and the free oil in the well interval by utilizing the NMR log data according to the $T_2$ cutoff value $T_{2cut1}$ between the absorbed water and the absorbed oil as well as the $T_2$ cutoff value $T_{2cut2}$ between the absorbed oil and the free oil that are determined in the step 7 and step 9, and the calculation result is shown in FIG. 10.

Step 11: analyzing the well interval according to the calculated saturation of the absorbed oil and the free oil in the well interval.

The present invention also provides a computer device, which may be a desktop computer, a tablet computer and a mobile terminal, and etc., and the present embodiment is not limited thereto. In this embodiment, the computer device may complete the implementation of the shale oil analysis method for continuously characterizing saturation of adsorbed oil and free oil.

Figure 11:
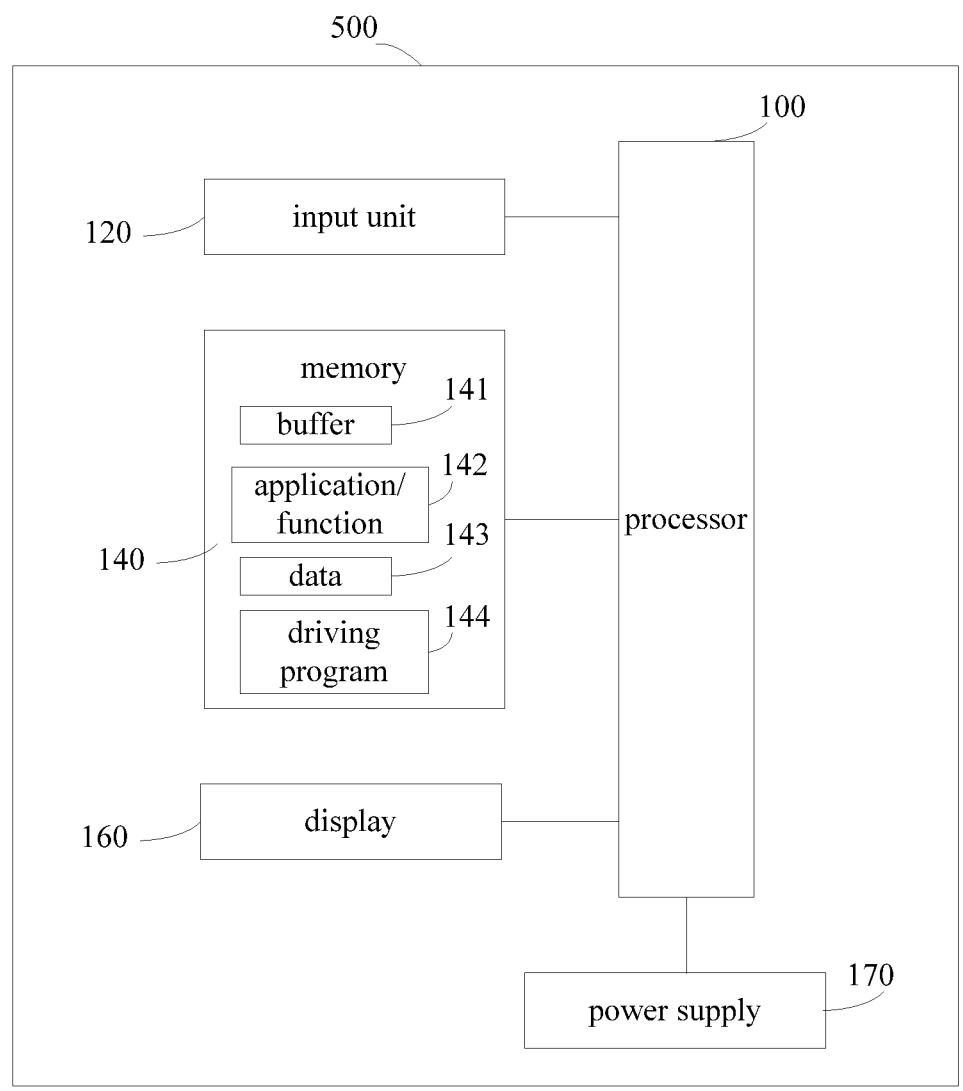
FIG. 11 is a schematic block diagram showing a system composition of a computer device provided in an embodiment of the invention.

FIG. 11 is a schematic block diagram of a system composition of a computer device 500 according to an embodiment of the present invention. As shown in FIG. 11, the computer device 500 may include a processor 100 and a memory 140 coupled to the processor 100. It is worth noting that this figure is exemplary; other types of structures may also be used in addition to or instead of the structure to implement telecommunications functions or other functions.

In an embodiment, a computer program implementing a shale oil analysis method for continuously characterizing saturation of absorbed oil and free oil may be integrated into a processor 100. Herein, the processor 100 may be configured to perform the following controls of:

acquiring NMR log data of a well interval to be analyzed;

performing a NMR measurement, a saturation measurement and an Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit value for the saturation calculation of the absorbed oil based on the NMR $T_2$ spectrum, the NMR porosity, the oil saturation and the wettability index of the core sample;

acquiring a bulk relaxation $T_2$ spectrum of crude oil in the well interval to be analyzed and a well interval having a same depth as a depth of the well section to be analyzed in an adjacent well, and determining a lower limit value for the saturation calculation of the free oil according to the bulk relaxation $T_2$ spectrum of the crude oil and the NMR $T_2$ spectrum of the core sample;

continuously and quantitatively calculating the saturation of the absorbed oil and the free oil in the well interval to be analyzed, according the NMR log data of the well interval to be analyzed, the lower limit value for the saturation calculation of the absorbed oil and the free oil; and analyzing the shale oil in the well interval to be analyzed, according to the saturation of the absorbed oil and the free oil in the well interval to be analyzed.

In an embodiment of the present invention, when executing the computer program, the processor implements the following controls of:

the twin core samples comprising a first core sample and a second core sample, wherein the first core sample and the second core sample are samples obtained by splitting a core plunger sample drilled in a direction parallel to a bedding into two; and determining the lower limit value for the saturation calculation of the absorbed oil by:

performing the NMR measurement on the first core sample at a formation temperature, to obtain a NMR $T_2$ spectrum and a NMR porosity of the first core sample;

selecting a second core sample corresponding to the first core sample which has a NMR porosity greater than a preset threshold value and a bulk relaxation peak on the NMR $T_2$ spectrum that satisfies a preset condition, and performing the Amott wettability measurement on the second core sample, to obtain a wettability index of a corresponding second core sample;

performing the saturation measurement on the first core sample which has the NMR porosity greater than the preset threshold value and the bulk relaxation peak on the NMR $T_2$ spectrum that satisfies the preset condition, to obtain an oil saturation and a water saturation of the first core sample; and selecting a NMR $T_2$ spectrum of the first core sample corresponding to the second core sample with the wettability index representing a weakly oil-wet property and an oil-wet property according to the wettability index of the corresponding second core sample, and determining a pore percentage according to the NMR $T_2$ spectrum of the corresponding first core sample, a $T_2$ transverse relaxation time corresponding to a point at which the pore percentage is equal to the water saturation of the corresponding first core sample being the lower limit value for the saturation calculation of the absorbed oil.

In an embodiment of the present invention, when executing the computer program, the processor implements the following controls of:

determining the lower limit value for the saturation calculation of the free oil by:

selecting the NMR $T_2$ spectrum of the multiple first core sample corresponding to the multiple second core sample with the wettability index representing a strongly oil-wet property according to the wettability index of the corresponding second core sample, comparing the NMR $T_2$ spectrum of the corresponding multiple first core sample with the bulk relaxation $T_2$ spectrum of the crude oil, when it is recognized that the last peak of the NMR $T_2$ spectrum of the corresponding multiple first core sample is the bulk relaxation $T_2$ spectrum and the time corresponding to the left valley of the NMR $T_2$ volume of the corresponding multiple first core samples is the same, determining the time corresponding to the left wave valley as the lower limit value for the saturation calculation of the free oil.

In another embodiment, the shale oil analysis function of the continuous characterization of the saturation of the absorbed oil and the free oil may be configured separately from the processor 100, for example, the shale oil analysis function of the continuous characterization of the saturation of the absorbed oil and the free oil may be configured on a chip coupled to the processor 100, and the function of shale oil analysis for continuous characterization of the saturation of absorbed oil and the free oil can be realized by the control of the processor.

As shown in FIG. 11, the computer device 500 may further include an input unit 120, a display 160, and a power supply 170. It is worth noting that the computer device 500 does not either necessarily include all the components shown in FIG. 11; in addition, the computer device 500 may also include components not shown in FIG. 11, referring to the prior art.

Herein, the processor 100, sometimes referred to as a controller or an operational control, may include a microprocessor or other processor apparatuses and/or logic apparatuses, the processor 100 receives inputs and controls operations of the components of the computer device 500.

The input unit 120 provides an input to the processor 100. The input unit 120 is, for example, a key or a touch input apparatus.

The memory 140 may be, for example, one or more of a buffer, a flash memory, a hard drive, a removable medium, a volatile memory, a non-volatile memory, and other suitable apparatuses. A program executing related information may be stored, and the processor 100 may execute the program stored in the memory 140 to implement information storage or processing or the like.

The memory 140 may be a solid-state memory such as a read only memory (ROM), a random access memory (RAM), a SIM card, or the like. The memory may also be such a memory that it holds information even when power is off, on which data can be selectively erased and more data is set, and an example of which is sometimes referred to as an EPROM or the like. The memory 140 may also be some other types of apparatuses. The memory 140 includes a buffer memory 141 (sometimes referred to as a buffer). The memory 140 may include an application/function storage unit 142 for storing application programs and function programs or a flow for performing operations of an electronic device by the processor 100.

The memory 140 may also include a data storage unit 143 for storing data, such as contacts, digital data, pictures, sounds, and/or any other data used by the electronic device. A drive program storage unit 144 of the memory 140 may include various drive programs of the electronic device for communication functions and/or for executing other functions of the electronic device, such as a messaging application, an address book application, and the like.

The display 160 is used for displaying objects to be displayed, such as images and text, and the like. The display may be, for example, an LCD display, but is not limited thereto.

The power supply 170 is used to provide power to the computer device 500.

The embodiment of the present invention also provides a computer-readable storage medium which stores a computer program for executing the following steps of:

acquiring NMR log data of a well interval to be analyzed;

performing a NMR measurement, a saturation measurement and an Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit value for the saturation calculation of the absorbed oil based on the NMR $T_2$ spectrum, the NMR porosity, the oil saturation and the wettability index of the core sample;

acquiring a bulk relaxation $T_2$ spectrum of crude oil in the well interval to be analyzed and a well interval having a same depth as a depth of the well interval to be analyzed in an adjacent well, and determining a lower limit value for the saturation calculation of the free oil according to the bulk relaxation $T_2$ spectrum of the crude oil and the NMR $T_2$ spectrum of the core sample;

continuously and quantitatively calculating the saturation of the absorbed oil and the content of the free oil in the well interval to be analyzed, according the NMR log data of the well interval to be analyzed, the lower limit value for the saturation calculation of the absorbed oil and the free oil; and analyzing the shale oil in the well interval to be analyzed, according to the saturation of the absorbed oil and the free oil in the well interval to be analyzed.

The computer-readable storage medium may include physical means for storing information, and the physical means may digitize and then store information in a medium using electrical, magnetic or optical means. The computer-readable storage medium according to the present embodiments may include an apparatus for storing information in an electric energy manner, e.g., various types of memories such as RAM, ROM, or the like; an apparatus for storing information by means of magnetic energy, such as a hard disk, a floppy disk, a magnetic tape, a magnetic core memory, a bubble memory, or a U disk; an apparatus for storing information optically, such as a CD or a DVD. Of course, there are other ways of readable storage media, such as a quantum memory, a graphene memory, or the like.

In conclusion, in the present invention, the lower limit value for the saturation calculation of the absorbed oil is comprehensively determined by using a core wettability, a saturation and a NMR $T_2$ spectrum; the lower limit value for the saturation calculation of the free oil is determined by using the bulk relaxation $T_2$ spectrum of the crude oil and a NMR measurement of the core; the saturation of the adsorbed oil and the free oil are calculated continuously by using the NMR log spectrum, the lower limit value for the saturation calculation of the absorbed oil and the free oil; and the shale oil in the well interval to be analyzed is analyzed according to the saturation of the absorbed oil and the free oil. Compared with the prior art, the invention realizes the quantitative and continuous characterization of the adsorbed oil and the free oil via well logs in the shale oil, solves the technical problem in the industry, and provides core parameters for evaluation and production of the shale oil "sweet spot".

The foregoing is merely preferred embodiments of the present invention and is not intended to limit the present invention, and various modifications and variations can be made to the embodiment of the present invention by those skilled in the art. Any modifications, equivalents, improvements, etc. made within the spirit and principle of the present invention are intended to be included within the protection scope of the present invention.

The invention claimed is:

1. A shale oil analysis method for continuously characterizing saturation of absorbed oil and free oil, wherein the method comprises steps of:
    acquiring NMR log data of a well interval to be analyzed;
    performing a NMR measurement, a saturation measurement and an Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit of a saturation calculation of adsorbed oil based on the NMR $T_2$ spectrum, the NMR porosity, the oil saturation and the wettability index of the core sample;
    acquiring a bulk relaxation $T_2$ spectrum of crude oil in the well interval to be analyzed and a well interval having a same depth as a depth of the well interval to be analyzed in an adjacent well, and determining a lower limit of a saturation calculation of free oil according to the bulk relaxation $T_2$ spectrum of the crude oil and the NMR $T_2$ spectrum of the core sample;
    continuously and quantitatively calculating the saturation of the absorbed oil and the free oil in the well interval to be analyzed, according the NMR log data of the well interval to be analyzed, the lower limit of the saturation calculation of adsorbed oil and the free oil; and
    analyzing the shale oil in the well interval to be analyzed, according to the saturation of the absorbed oil and the free oil in the well interval to be analyzed.

2. The shale oil analysis method for continuously characterizing saturation of absorbed oil and free oil according to claim 1, wherein the core sample comprises a first core sample and a second core sample, wherein the first core sample and the second core sample are samples obtained by splitting a core plunger sample drilled in a direction parallel to a bedding into two;
    said performing a NMR measurement, a saturation measurement and an Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit of the saturation calculation of adsorbed oil based on the NMR $T_2$ spectrum, the NMR porosity, the oil saturation and the wettability index of the core sample comprises:
    performing the NMR measurement on the first core sample at a formation temperature, to obtain a NMR $T_2$ spectrum and a NMR porosity of the first core sample;
    selecting the second core sample corresponding to the first core sample which has a NMR porosity greater than a preset threshold value and a bulk relaxation peak on the NMR $T_2$ spectrum that satisfies a preset condition, and performing the Amott wettability measurement on the second core sample, to obtain a wettability index of a corresponding second core sample;
    performing the saturation measurement on the first core sample which has the NMR porosity greater than the preset threshold value and the bulk relaxation peak on the NMR $T_2$ spectrum that satisfies the preset condition, to obtain an oil saturation and a water saturation of the first core sample; and
    selecting a NMR $T_2$ spectrum of the first core sample corresponding to the second core sample with the wettability index representing a weakly oil-wet property and an oil-wet property according to the wettability index of the corresponding second core sample, and determining a pore percentage according to the NMR $T_2$ spectrum of the corresponding first core sample, a $T_2$ transverse relaxation time corresponding to a point at which the pore percentage is equal to the water saturation of the corresponding first core sample being the lower limit of the saturation calculation of adsorbed oil.

3. The shale oil analysis method for continuously characterizing saturation of absorbed oil and free oil according to claim 1, wherein determining a lower limit of the saturation calculation of free oil according to the bulk relaxation $T_2$ spectrum of the crude oil and the NMR $T_2$ spectrum of the core sample comprises:

selecting the NMR $T_2$ spectrum of multiple first core sample corresponding to multiple second core sample with the wettability index representing a strongly oil-wet property according to the wettability index of the corresponding second core sample, comparing the NMR $T_2$ spectrum of the corresponding multiple first core sample with the bulk relaxation $T_2$ spectrum of the crude oil, when it is recognized that a last peak of the NMR $T_2$ spectrum of the corresponding multiple first core sample is the bulk relaxation spectrum and the time corresponding to a left valley of the NMR $T_2$ volume of the corresponding multiple first core samples is the same, determining the time corresponding to the left valley as the lower limit of the saturation calculation of free oil.

4. The shale oil analysis method for continuously characterizing saturation of absorbed oil and free oil according to claim 1, wherein lower limit of the saturation calculation of adsorbed oil is determined according to the following formula:

$$S_{absorption\ oil} = \frac{\sum_{i=T_{2cut1}}^{T_{2cut2}} P_i}{\sum_{i=0.3}^{3000} P_i};$$

where, $S_{absorption\ oil}$ denotes the saturation of the absorbed oil; $P_i$ denotes pore volume corresponding to the ith relaxation time component, dimensionless and decimal; $T_{2cut1}$ denotes the lower limit of the saturation calculation of adsorbed oil, in the unit of ms;

The lower limit of the saturation calculation of free oil is determined according to the following formula:

$$S_{free\ oil} = \frac{\sum_{i=T_{2cut2}}^{3000} P_i}{\sum_{i=0.3}^{3000} P_i};$$

where, $S_{free\ oil}$ denotes the saturation of free oil, dimensionless and decimal; and $T_{2cut2}$ denotes the lower limit of the saturation calculation of free oil, in the unit of ms.

5. A computer device comprising a non-transitory memory, a processor and a computer program stored on the memory and when executed by the processor causes the processor to perform a method, the method comprising:

acquiring NMR log data of a well interval to be analyzed;

performing a NMR measurement, a saturation measurement and an Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit of the saturation calculation of adsorbed oil based on the NMR $T_2$ spectrum, the NMR porosity, the oil saturation and the wettability index of the core sample;

acquiring a bulk relaxation $T_2$ spectrum of crude oil in the well interval to be analyzed and a well interval having a same depth as a depth of the well interval to be analyzed in an adjacent well, and determining a lower limit of the saturation calculation of free oil according to the bulk relaxation $T_2$ spectrum of the crude oil and the NMR $T_2$ spectrum of the core sample;

continuously and quantitatively calculating the saturation of the absorbed oil and the free oil in the well interval to be analyzed, according the NMR log data of the well interval to be analyzed, the lower limit of the saturation calculation of adsorbed oil and the free oil; and analyzing the shale oil in the well interval to be analyzed, according to the saturation of the absorbed oil and the free oil in the well interval to be analyzed.

6. The computer device according to claim 5, further comprising:

the core sample comprising a first core sample and a second core sample, wherein the first core sample and the second core sample are samples obtained by splitting a core plunger sample drilled in a direction parallel to a bedding into two; and determining the lower limit of the saturation calculation of adsorbed oil by:

performing the NMR measurement on the first core sample at a formation temperature, to obtain a NMR $T_2$ spectrum and a NMR porosity of the first core sample;

selecting the second core sample corresponding to the first core sample which has a NMR porosity greater than a preset threshold value and a bulk relaxation peak on the NMR $T_2$ spectrum that satisfies a preset condition, and performing the Amott wettability measurement on the second core sample, to obtain a wettability index of a corresponding second core sample;

performing the saturation measurement on the first core sample which has the NMR porosity greater than the preset threshold value and the bulk relaxation peak on the NMR $T_2$ spectrum that satisfies the preset condition, to obtain an oil saturation and a water saturation of the first core sample; and selecting a NMR $T_2$ spectrum of the first core sample corresponding to the second parallel analysis sample with the wettability index representing a weak oil wet property and an oil wet property according to the wettability index of the corresponding second core sample, and determining a pore percentage according to the NMR $T_2$ spectrum of the corresponding first core sample, a $T_2$ transverse relaxation time corresponding to a point at which the pore percentage is equal to the water saturation of the corresponding first core sample being the lower limit of the saturation calculation of adsorbed oil.

7. The computer device according to claim 6, wherein to implement the following:

determining the lower limit of the saturation calculation of free oil by:

selecting the NMR $T_2$ spectrum of multiple first core sample corresponding to multiple second core sample with the wettability index representing a strong oil wet property according to the wettability index of the corresponding second core sample, comparing the NMR $T_2$ spectrum of the corresponding first core sample with the bulk relaxation $T_2$ spectrum of the crude oil, when it is recognized that a last peak of the NMR $T_2$ spectrum of the corresponding multiple first core sample is the bulk relaxation spectrum and the time corresponding to a left valley of the NMR $T_2$ volume of the corresponding multiple first parallel analysis samples is the same, determining the time corresponding to the left valley as the lower limit of the saturation calculation of free oil.

8. The computer device according to claim 7, wherein the lower limit of the saturation calculation of adsorbed oil is determined according to the following formula:

$$S_{absorption\ oil} = \frac{\sum_{i=T_{2cut1}}^{T_{2cut2}} P_i}{\sum_{i=0.3}^{3000} P_i};$$

where, $S_{absorption\ oil}$ denotes the saturation of the absorbed oil; $P_i$ denotes pore volume corresponding to the ith relaxation time component, dimensionless and decimal; $T_{2cut1}$ denotes the lower limit value for the lower limit of the saturation calculation of adsorbed oil, in the unit of ms;

The lower limit of the saturation calculation of free oil is determined according to the following formula:

$$S_{free\ oil} = \frac{\sum_{i=T_{2cut2}}^{3000} P_i}{\sum_{i=0.3}^{3000} P_i};$$

where, $S_{free\ oil}$ denotes the saturation of free oil, dimensionless and decimal; and $T_{2cut2}$ denotes the lower limit of the saturation calculation of free oil, in the unit of ms.

9. A non-transitory computer-readable medium, in which a computer program for continuously characterizing saturation of absorbed oil and free oil is stored which, when executed by a processor, causes the processor to execute a method for continuously characterizing saturation of absorbed oil and free oil, the method comprising:
  acquiring NMR log data of a well interval to be analyzed;
  performing a NMR measurement, a saturation measurement and a Amott wettability measurement on a core sample acquired from a "sweet spot" in the well interval to be analyzed, to obtain a NMR $T_2$ spectrum, a NMR porosity, an oil saturation and a wettability index of the core sample, and determine a lower limit of the saturation calculation of adsorbed oil based on the NMR $T_2$ spectrum, the NMR porosity, the oil saturation and the wettability index of the core sample;
  acquiring a bulk relaxation $T_2$ spectrum of crude oil in the well interval to be analyzed and a well interval having a same depth as a depth of the well interval to be analyzed in an adjacent well, and determining a lower limit of the saturation calculation of free oil according to the bulk relaxation $T_2$ spectrum of the crude oil and the NMR $T_2$ spectrum of the core sample;
  continuously and quantitatively calculating the saturation of the absorbed oil and the free oil in the well interval to be analyzed, according the NMR log data of the well to be analyzed, the lower limit of the saturation calculation of adsorbed oil and the free oil; and
  analyzing the shale oil in the well interval to be analyzed, according to the saturation of the absorbed oil and the free oil in the well interval to be analyzed.

10. The non-transitory computer-readable medium according to claim 9, wherein the method comprising:
  the core sample comprising a first core sample and a second core sample, wherein the first core sample and the core analysis sample are samples obtained by splitting a core plunger sample drilled in a direction parallel to a bedding into two; and
  determining the lower limit of the saturation calculation of adsorbed oil by:
  performing the NMR measurement on the first core sample at a formation temperature, to obtain a NMR $T_2$ spectrum and a NMR porosity of the first core sample;
  selecting the second core sample corresponding to the first core sample which has a NMR porosity greater than a preset threshold value and a bulk relaxation peak on the NMR $T_2$ spectrum that satisfies a preset condition, and performing the Amott wettability measurement on the second core sample, to obtain a wettability index of a corresponding second core sample;
  performing the saturation measurement on the first core sample which has the NMR porosity greater than the preset threshold value and the bulk relaxation peak on the NMR $T_2$ spectrum that satisfies the preset condition, to obtain an oil saturation and a water saturation of the first core sample; and
  selecting a NMR $T_2$ spectrum of the first core sample corresponding to the second core sample with the wettability index representing a weakly oil-wet property and an oil-wet property according to the wettability index of the corresponding second core sample, and determining a pore percentage according to the NMR $T_2$ spectrum of the corresponding first core sample, a $T_2$ transverse relaxation time corresponding to a point at which the pore percentage is equal to the water saturation of the corresponding first core sample being the lower limit of the saturation calculation of adsorbed oil.

11. The non-transitory computer-readable medium according to claim 10, wherein the method comprising:
  determining the lower limit of the saturation calculation of free oil by:
  selecting the NMR $T_2$ spectrum of multiple first core sample corresponding to multiple second core sample with the wettability index representing a strongly oil-wet property according to the wettability index of the corresponding second core sample, comparing the NMR $T_2$ spectrum of the corresponding multiple first core sample with the bulk relaxation $T_2$ spectrum of the crude oil, when it is recognized that a last peak of the NMR $T_2$ spectrum of the corresponding multiple first core sample is the bulk relaxation spectrum and the time corresponding to a left valley of the NMR $T_2$ volume of the corresponding multiple first core samples is the same, determining the time corresponding to the left valley as the lower limit of the saturation calculation of free oil.

12. The non-transitory computer-readable medium according to claim 11, wherein the lower limit of the saturation calculation of adsorbed oil is determined according to the following formula:

$$S_{absorption\ oil} = \frac{\sum_{i=T_{2cut1}}^{T_{2cut2}} P_i}{\sum_{i=0.3}^{3000} P_i};$$

where, $S_{absorption\ oil}$ denotes the saturation of the absorbed oil; $P_i$ denotes pore volume corresponding to the ith relaxation time component, dimensionless and decimal; $T_{2cut1}$ denotes the lower limit of the lower limit of the saturation calculation of adsorbed oil, in the unit of ms;

The lower limit of the saturation calculation of free oil is determined according to the following formula:

$$S_{free\ oil} = \frac{\sum_{i=T_{2cut2}}^{3000} P_i}{\sum_{i=0.3}^{3000} P_i};$$

where, $S_{free\ oil}$ denotes the saturation of free oil, dimensionless and decimal; and $T_{2cut2}$ denotes the lower limit of the saturation calculation of free oil, in the unit of ms.

\* \* \* \* \*